United States Patent
Roether et al.

(10) Patent No.: US 8,161,821 B2
(45) Date of Patent: Apr. 24, 2012

(54) CONDUCTOR TRACK CARRIER AND METHOD FOR THE PRODUCTION OF A CONDUCTOR TRACK CARRIER

(75) Inventors: Friedbert Roether, Cleebronn (DE); Thomas Uhland, Pfaffenhofen (DE); Christine Erb, Pforzheim (DE)

(73) Assignee: KNORR-BREMSE Systeme fuer Nutzfahrzeuge GmbH, Munich (DE)

( * ) Notice: Subject to any disclaimer, the term of this patent is extended or adjusted under 35 U.S.C. 154(b) by 0 days.

(21) Appl. No.: 12/832,737

(22) Filed: Jul. 8, 2010

(65) Prior Publication Data

US 2010/0313666 A1     Dec. 16, 2010

Related U.S. Application Data

(63) Continuation of application No. PCT/EP2008/010933, filed on Dec. 19, 2008.

(30) Foreign Application Priority Data

Jan. 11, 2008    (DE) .......................... 10 2008 003 954

(51) Int. Cl.
    *G01L 7/00*    (2006.01)
(52) U.S. Cl. ...................................................... 73/756
(58) Field of Classification Search .................... None
    See application file for complete search history.

(56) References Cited

U.S. PATENT DOCUMENTS

| | | | |
|---|---|---|---|
| 5,021,888 A | 6/1991 | Kondou et al. | |
| 5,763,787 A | 6/1998 | Gravel et al. | |
| 5,951,487 A | 9/1999 | Brehmeier-Flick et al. | |
| 6,300,566 B1 * | 10/2001 | Scheuerer et al. ............ | 174/541 |
| 6,806,701 B2 | 10/2004 | Apel et al. | |
| 2001/0017538 A1 * | 8/2001 | Loibl et al. .................. | 324/207.2 |
| 2003/0178627 A1 * | 9/2003 | Marchl et al. .................... | 257/80 |
| 2007/0017294 A1 | 1/2007 | Asada et al. | |
| 2007/0184682 A1 | 8/2007 | Gobron | |
| 2007/0283923 A1 | 12/2007 | Khelifati et al. | |
| 2009/0052178 A1 * | 2/2009 | Marchl et al. ............ | 362/249.02 |
| 2009/0239401 A1 * | 9/2009 | Fink et al. ...................... | 439/214 |
| 2011/0135255 A1 * | 6/2011 | Matiss et al. .................... | 385/92 |

FOREIGN PATENT DOCUMENTS

| | | |
|---|---|---|
| DE | 196 38 813 C1 | 3/1998 |
| DE | 198 42 224 C2 | 4/2000 |
| DE | 198 44 556 A1 | 4/2000 |
| DE | 200 03 512 U1 | 8/2001 |
| DE | 203 04 579 U1 | 7/2003 |

(Continued)

OTHER PUBLICATIONS

German Office Action dated Oct. 15, 2008 including English-language translation (Six (6) pages).

(Continued)

*Primary Examiner* — Andre Allen
(74) *Attorney, Agent, or Firm* — Crowell & Moring LLP

(57) ABSTRACT

A conductor track carrier, particularly a leadframe that is preferably insert-molded with plastic or a rigid/flexible circuit carrier, includes one or more conductor tracks, which are received and held at least partially by a conductor track carrier component designed in one piece. The conductor track carrier component is designed such that it receives and holds furthermore at least one component of one or more sensors. A method of producing such a conductor track carrier is also provided.

12 Claims, 4 Drawing Sheets

FOREIGN PATENT DOCUMENTS

| | | |
|---|---|---|
| DE | 20 2005 017 626 U1 | 2/2006 |
| DE | 10 2006 026 446 A1 | 12/2007 |
| JP | 4-323909 A | 11/1992 |
| WO | WO 99/04457 A1 | 1/1999 |
| WO | WO 2007128591 A1 * | 11/2007 |
| WO | WO 2008/103626 A2 | 8/2008 |

OTHER PUBLICATIONS

International Search Report dated Apr. 28, 2009 including English-language translation Six (6) pages).

* cited by examiner

CONDUCTOR TRACK CARRIER AND METHOD FOR THE PRODUCTION OF A CONDUCTOR TRACK CARRIER

CROSS-REFERENCE TO RELATED APPLICATIONS

This application is a continuation of PCT International Application No. PCT/EP2008/010933, filed Dec. 19, 2008, which claims priority under 35 U.S.C. §119 from German Patent Application No. DE 10 2008 003 954.3, filed Jan. 11, 2008, the entire disclosures of which are herein expressly incorporated by reference.

BACKGROUND AND SUMMARY OF THE INVENTION

The invention relates to a conductor track carrier, in particular a leadframe that is insert-molded with, preferably, a plastic, or a rigid/flexible circuit carrier, comprising one or a plurality of conductor tracks, which are accommodated and held at least in part by a conductor track carrier component formed in one piece.

The invention furthermore relates to a method for the production of a conductor track carrier of this type.

Conductor track carriers are generally known, for example, in the form of leadframes that are insert-molded with plastic, or flexible/rigid circuit carriers.

In the case of a conductor track carrier formed as a leadframe that is insert-molded with plastic, or as a leadframe with plastic insert-molding, the leadframe is conventionally formed as a usually two-dimensional conductor track network which is produced by stamping and which preferably comprises a plurality of conductor tracks. One conventional application is the creation of a system of electrical conductors or electrical conductor tracks in only one production step, the conductor tracks usually being produced or stamped from a metal strip. In further refinement steps, the leadframe is insert-molded with plastic, for example, resulting in the formation of a conductor track carrier component that accommodates and holds the leadframe at least in part in the form of a plastic insert-molding.

In order to obtain higher numbers of items or to enable more complex applications, firstly single-layered three-dimensional leadframes can be created from continuous metal strips on interlinked stamping-bending machines. Stacking these single-layered leadframes then gives rise to a multilayered leadframe stack. This usually necessitates interlayers composed of an insulator, which can simultaneously serve as a mechanical carrier of the individual layers. If appropriate, individual runs of the network can be individually stamped free in a subsequent work operation.

In the case of a conductor track carrier embodied as a flexible or rigid injection-molded circuit carrier, by way of example, metallic conductor tracks are applied to the injection-molded plastic carrier such that the injection-molded plastic carrier functions as a conductor track carrier component and accommodates and holds the corresponding conductor tracks at least in part. By way of example, in connection with rigid or flexible printed circuit boards, the connecting lines or conductor tracks are usually produced by etching from a thin layer of conductive material on an insulating substrate or the conductor track carrier component. Electrical/electronic components such as sensors, for example, are usually soldered onto the conductor tracks afterward.

Usually, particularly in the motor vehicle sector, leadframes that are insert-molded with plastic or flexible/rigid circuit carriers are used and are electrically connected to various sensors or measuring cells. Primarily in connection with commercial vehicles, it is necessary to satisfy stringent requirements made of the resistance to vibration and lifetime of all electrical/electronic components in the commercial vehicle, in particular of conductor track carriers with separate sensors provided thereon. Furthermore, there is often only limited structural space in the commercial vehicle, as a result of which these requirements can be complied with only with greater difficulty.

It is known from the prior art, by way of example, for sensors or measuring cells embodied as separate components to be embodied with a separate sensor housing and for the sensor together with sensor housing to be fitted to the corresponding conductor track carrier, in particular to the corresponding conductor tracks of the conductor track carrier, in order to produce an electrical connection.

FIG. 1 shows, by way of example, an illustration of a conductor track carrier 10' associated with the prior art and comprising a leadframe that is insert-molded with plastic and a separate sensor 16' provided thereon. FIG. 2 shows an enlarged illustration of the separate sensor 16' from FIG. 1. As can be seen from FIGS. 1 and 2, the conductor track carrier 10' includes a multiplicity of conductor tracks 12' or a leadframe that forms the multiplicity of conductor tracks 12'. The leadframe is insert-molded with plastic or has a plastic insert-molding 14'. The plastic insert-molding 14' thus accommodates and holds the multiplicity of conductor tracks 12' at least in part. Furthermore, at least one sensor 16' accommodated in a separate sensor housing 18' together with sensor housing 18' is provided on the conductor track carrier 10' and electrically coupled to the conductor track carrier 10' via at least some conductor tracks 12' of the leadframe. This embodiment of the conductor track carrier 10' together with sensor 16' results in disadvantages with regard to the available structural space and its vibration resistance since the sensor housing 18' can loosen at least at times on account of vibrations prevailing in the commercial vehicle. Furthermore, such an embodiment is costly and has a lower robustness and also a reduced lifetime on account of the increased number of contact locations.

Therefore, the invention is based on the object of developing generic conductor track carriers, and methods for the production of such conductor track carriers, such that the above-mentioned disadvantages can be overcome at least in part.

This object is achieved by a conductor track carrier, in particular a leadframe that is insert-molded with, preferably, plastic, or a rigid/flexible circuit carrier, including one or more conductor tracks, which are accommodated and held at least in part by a conductor track carrier component formed in one piece. The conductor track carrier component is formed such that it also accommodates and holds at least one component of one or a plurality of sensors.

Advantageous configurations and developments of the invention are described herein.

The conductor track carrier according to the invention builds on the generic prior art by virtue of the fact that the conductor track carrier component is formed such that it furthermore accommodates and holds at least one component of one or a plurality of sensors. By virtue of the fact that, by way of example, the plastic insert-molding is additionally shaped as a sensor housing and, consequently, also accommodates components of the sensor alongside the conductor tracks formed by the leadframe, structural space is saved.

Preferably all components of the sensor or of the sensors are accommodated. By virtue of the integration of components of the sensors or measuring cells into the leadframe that is insert-molded with plastic, and thus is additionally shaped as a sensor housing, the sensor housings that are usually formed separately can be obviated. This is advantageous particularly when the sensor housings that are usually formed separately are made from the same material as, for example, the plastic which accommodates and holds the leadframe at least in part and functions as a conductor track carrier component.

Consequently, the sensors or measuring cells can also be positioned directly onto the conductor track carrier according to the invention and be electrically contact-connected thereto. In a particularly advantageous manner, the conductor track carrier according to the invention achieves a very small structural space requirement, simultaneously reduces the number of electrical contact locations and reduces the number of parts overall. Given a suitable arrangement of the components with respect to one another, i.e. of the leadframe and of the sensors, an improvement in the vibration-technological properties of the conductor track carrier and of the sensors can furthermore be achieved. The above-mentioned advantages explained in connection with the leadframe that is insert-molded with plastic are also analogously applicable to the flexible or rigid circuit carrier in which, in this case, by way of example, the injection-molded plastic carrier functions as a conductor track carrier component and is shaped in such a way that it accommodates and holds, in addition to the conductor tracks or circuits, one or a plurality of components of one or a plurality of sensors at least in part. Furthermore, preferably all components, i.e. electrical/electronic components, such as sensor transmitter and sensor receiver elements, are accommodated in the conductor track carrier component, wherein the sensor or the measuring cell can be provided with or without evaluation electronics.

The conductor track carrier according to the invention can advantageously be developed such that the conductor track carrier component is formed in one piece by plastic insert-molding of the conductor tracks. In the context of this disclosure, the expression "formed in one piece" is intended to be accorded the meaning of "produced in one piece", without the scope of this expression encompassing further components fitted after the production of the conductor track carrier component, such as, for example, the sensor housing of the sensor associated with the prior art.

As an alternative, the conductor track carrier according to the invention can be implemented in such a way that the conductor track carrier component is formed by plastic parts which are coupled to one another and which accommodate and hold the conductor tracks at least in part. By way of example, preferably prefabricated plastic parts can also be used which are coupled or connected to one another such that they accommodate and hold the conductor tracks at least in part. Preferably, the plastic parts, for the purpose of accommodating the conductor tracks at least in part, are connected to one another or coupled to one another by friction welding, such that these in turn form a conductor track carrier component formed in one piece. In this case, too, the expression "formed in one piece" is intended to be accorded the meaning of "produced in one piece", without the scope of this expression encompassing further components fitted after the production of the conductor track carrier component, such as, for example, the sensor housing of the sensor associated with the prior art.

Furthermore, the conductor track carrier according to the invention can be realized such that the conductor track carrier component is formed in such a way that it accommodates or forms at least one further component of the sensor for detecting the measurement variable. Advantageously, the plastic insert-molding can be shaped such that it simultaneously forms one or a plurality of components of the sensor, for example a pressure space of a pressure sensor, and/or accommodates one or a plurality of components of the sensor.

Furthermore, the conductor track carrier according to the invention can be configured in such a way that at least one of the sensors is formed as a pressure sensor, which includes a pressure chamber for detecting the pressure. The pressure chamber is formed by the conductor track carrier component. The integration of an access for the measurement variable of the sensor into the conductor track carrier component is thus made possible, such as—in the case of the pressure sensor—the pressure space, which can be embodied as a pressure-tight channel. Furthermore, in this case, a seal can be captivity fitted to the plastic insert-molding; this is not absolutely necessary, however.

Furthermore, the conductor track carrier according to the invention can be realized such that the sensors are formed by at least one pressure, temperature, inclination angle, and/or rotation angle sensor. Measurement variables such as a pressure, a temperature, an inclination angle or a rotation angle, etc., can thereby be detected with the aid of the corresponding sensor or the corresponding measuring cell.

Furthermore, the conductor track carrier according to the invention can be implemented in such a way that an electrical contact-connection between the sensor and at least one conductor track is formed by bonding, soldering, insulation displacement connection, press-fitting or welding. However, further connection techniques known from the prior art may likewise be used.

The method according to the invention for the production of a conductor track carrier builds on the generic prior art by virtue of the fact that the conductor track carrier component is formed in such a way that it furthermore accommodates and holds at least one component of one or a plurality of sensors. As a result, the advantages explained in connection with the conductor track carrier according to the invention are afforded in an identical or similar manner, for which reason, in order to avoid repetition, reference is made to the corresponding explanations in connection with the conductor track carrier according to the invention.

The same applies analogously to the following preferred embodiments of the method according to the invention, in which case, in this regard, too, in order to avoid repetition, reference is made to the corresponding explanations in connection with the conductor track carrier according to the invention.

The method according to the invention can advantageously be developed such that the conductor track carrier component is formed in one piece by plastic insert-molding of the conductor tracks.

As an alternative, the method according to the invention can be implemented in such a way that the conductor track carrier component is formed by plastic parts which are coupled to one another and which accommodate and hold the conductor tracks at least in part.

Furthermore, the method according to the invention can be realized such that the conductor track carrier component is formed in such a way that it accommodates or forms at least one further component of the sensor for detecting the measurement variable.

Furthermore, the method according to the invention can also be implemented such that at least one of the sensors is provided as a pressure sensor, which includes a pressure chamber for detecting the pressure. The pressure chamber is formed by the conductor track carrier component.

Furthermore, the method according to the invention can be embodied in such a way that the sensors are provided by means of at least one pressure, temperature, inclination angle, and/or rotation angle sensor.

Furthermore, the method according to the invention can be realized such that an electrical contact-connection between the sensor and at least one conductor track is implemented by bonding, soldering, insulation displacement connection, press-fitting or welding.

Other objects, advantages and novel features of the present invention will become apparent from the following detailed description of one or more preferred embodiments when considered in conjunction with the accompanying drawings.

DETAILED DESCRIPTION OF THE DRAWINGS

Figure 1:
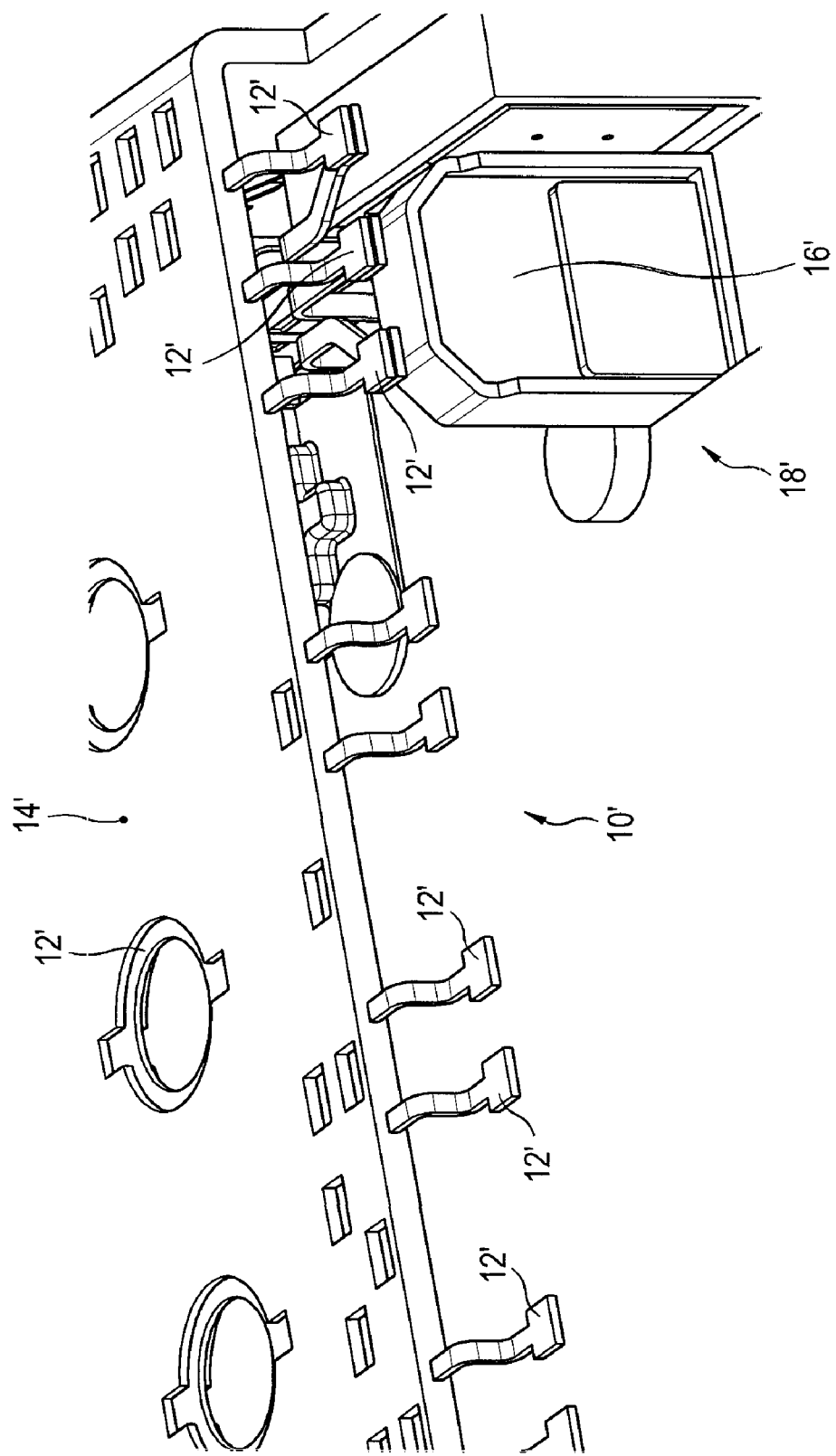
FIG. 1 is an illustration of a conductor track carrier associated with the prior art including a leadframe that is insert-molded with plastic with a separate sensor provided thereon.
Figure 2:
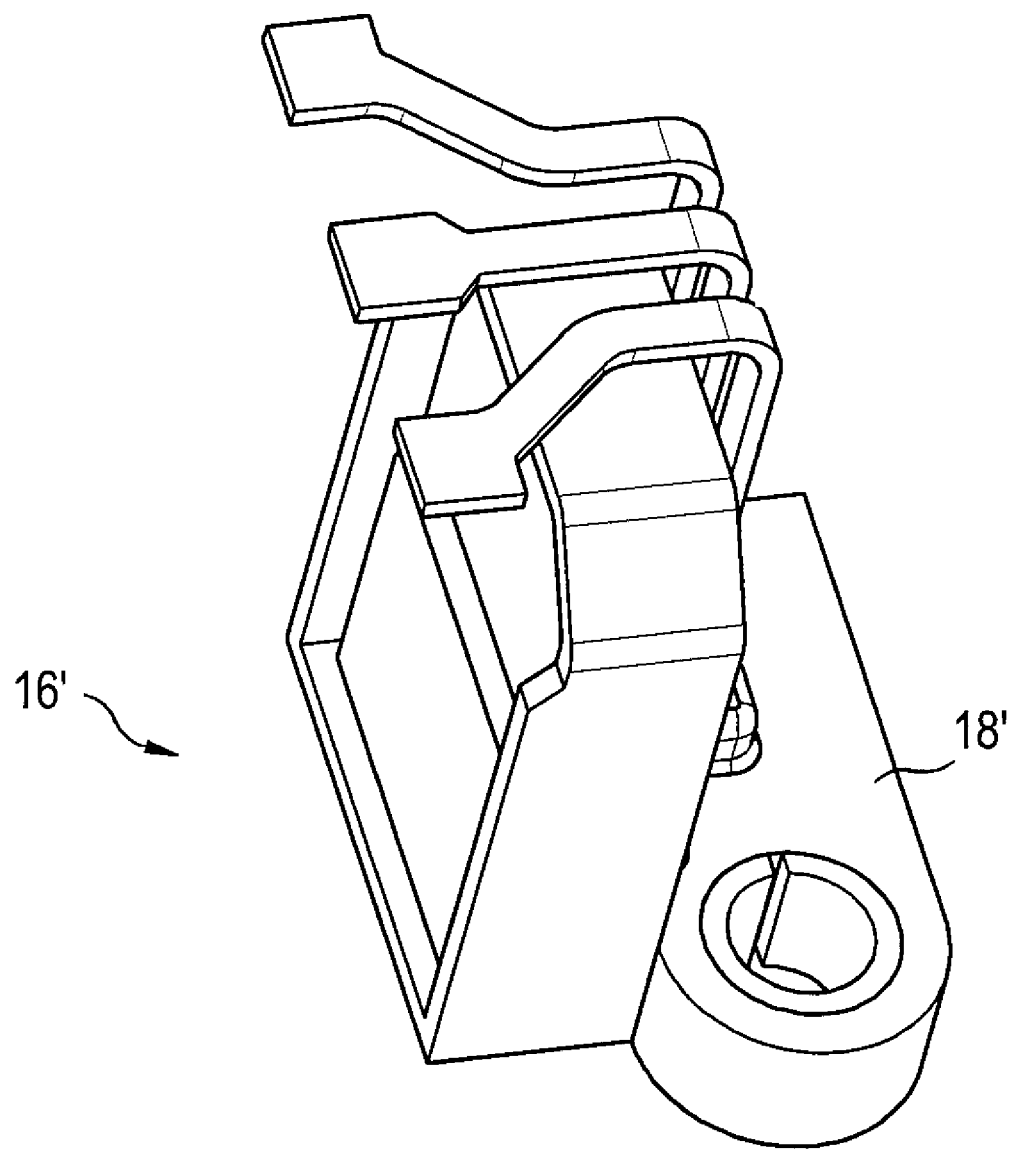
FIG. 2 is an enlarged illustration of a separate sensor from FIG. 1.
Figure 3:
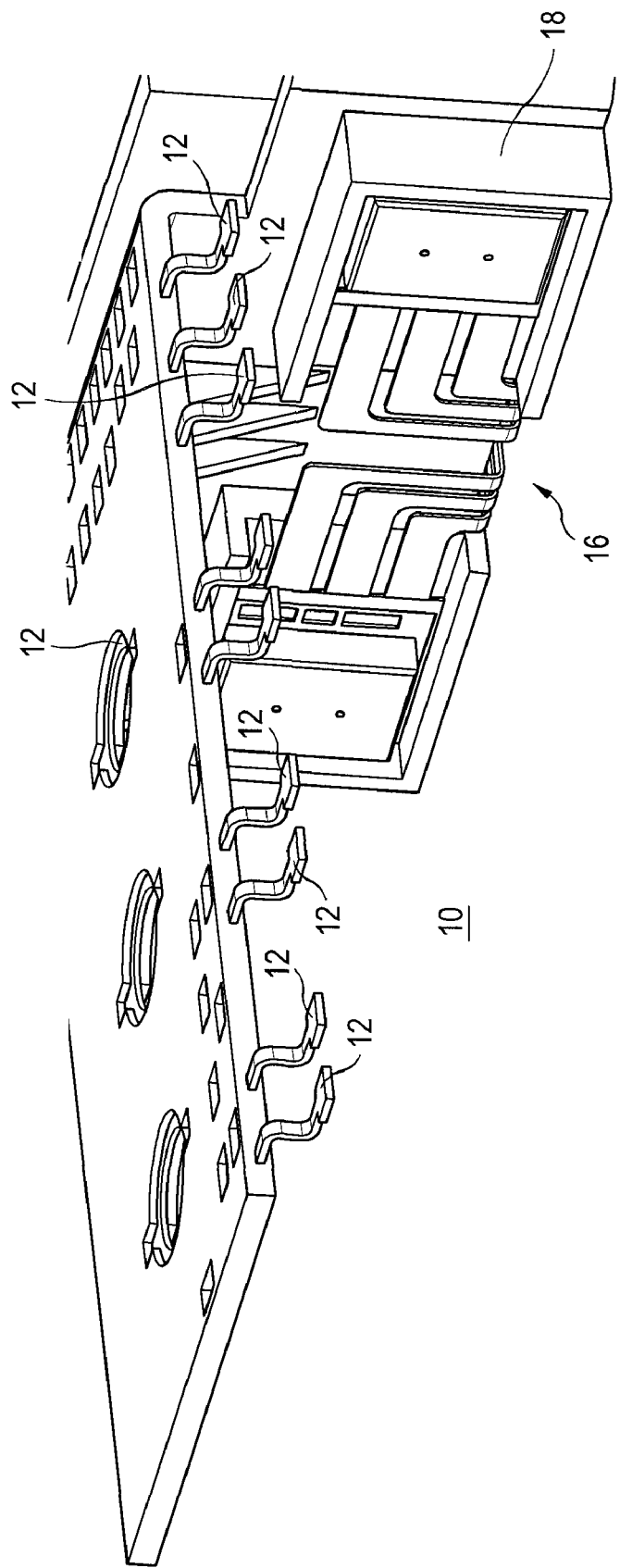
FIG. 3 is an illustration of a conductor track carrier according to the invention.
Figure 4:
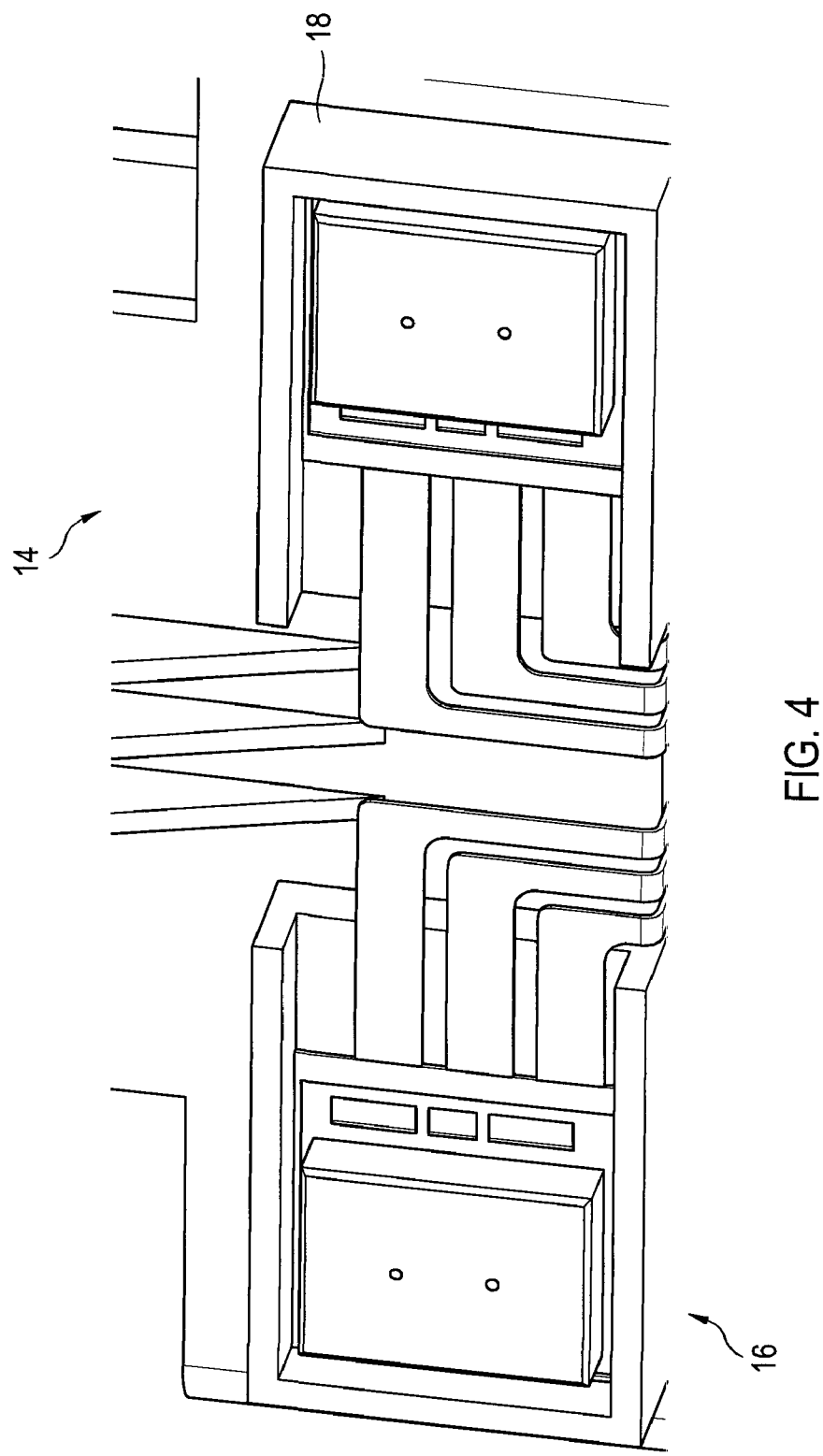
FIG. 4 is an enlarged illustration of an excerpt from FIG. 3.

FIG. 3 shows an illustration of a conductor track carrier 10 according to the invention, FIG. 4 showing an enlarged illustration of an excerpt from FIG. 3. In the exemplary embodiment illustrated, the conductor track carrier 10 is formed as a leadframe that is insert-molded with plastic and has conductor tracks 12. The plastic insert-molding 14 formed in one piece or produced in one piece accommodates and holds the leadframe having the conductor tracks 12 at least in part, such that the plastic insert-molding 14 functions as a conductor track carrier component. This therefore results in sections of the conductor tracks 12 that are held and surrounded or accommodated by the plastic insert-molding 14, and also free sections of the conductor tracks 12, that may function, for example, as contact-connection for sensors or other electrical/electronic components.

Furthermore, it can be seen from FIG. 3 and, in particular, FIG. 4, that the plastic insert-molding 14 furthermore shapes or forms at least one sensor housing 18 in which at least one sensor 16 is accommodated. It is likewise contemplated for the plastic insert-molding 14 to form a plurality of sensor housings 18, into each of which one or a plurality of sensors 16 can be inserted. Consequently, the plastic insert-molding 14 accommodates both the leadframe having the conductor tracks 12 and the sensor 16 at least in part. This advantageously allows a separate sensor housing, such as provided in the case of the prior art, to be dispensed with.

Preferably, different sensors 16 can be accommodated at least in part in the plastic insert-molding 14 forming a plurality of sensor housings 18. By way of example, the sensors 16 can be formed by at least one pressure, temperature, inclination angle, and/or rotation angle sensor. In particular, an electrical contact-connection between the sensor 16 and at least some of the conductor tracks 12 of the leadframe is formed by bonding, soldering, insulation displacement connection, press-fitting or welding.

The method according to the invention for the production of such a conductor track carrier 10 is configured as follows. The leadframe is produced by stamping. The leadframe in this case is formed by an at least two-dimensional conductor track network, and is insert-molded with plastic in such a way that it additionally forms one or a plurality of sensor housings 18. Afterward, the corresponding components of the sensors 16 are inserted into the sensor housing 18 and electrically contact-connected to corresponding conductor tracks 12 of the leadframe. Consequently, the corresponding components of the sensors 16, like the leadframe as well, are accommodated and held by the plastic insert-molding 14 at least in part. The electrical contact-connection between the corresponding sensors 16 and at least some of the conductor tracks 12 of the leadframe is in this case preferably effected by bonding, soldering, insulation displacement connection, press-fitting or welding.

| Table of Reference Symbols: | |
| --- | --- |
| 10' | Conductor track carrier |
| 12' | Leadframe having conductor tracks |
| 14' | Conductor track carrier component or plastic insert-molding |
| 16' | Separate sensor or separate measuring cell |
| 18' | Separate sensor housing |
| 10 | Conductor track carrier |
| 12 | Leadframe having conductor tracks |
| 14 | Conductor track carrier component or plastic insert-molding |
| 16 | Separate sensor or separate measuring cell |
| 18 | Sensor housing shaped from plastic insert-molding |

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A conductor track carrier, comprising:
    a conductor track carrier component formed in one piece;
    one or more conductor tracks accommodated and held, at least in part, by the conductor track carrier component;
    wherein the conductor track carrier component is formed such that it accommodates and holds at least one component of one sensor or a plurality of sensors;
    wherein the conductor track carrier component is formed such that it forms at least one further component of the one or a plurality of sensors for detecting a measurement variable; and
    wherein at least one of said sensors is a pressure sensor, the pressure sensor comprising: a pressure chamber for detecting pressure; and wherein said pressure chamber is formed by the conductor track carrier component.

2. The conductor track carrier according to claim 1, wherein the conductor track carrier comprises a leadframe insert-molded with plastic or a rigid/flexible circuit carrier.

3. The conductor track carrier according to claim 1, wherein the conductor track carrier component is formed in one-piece by plastic insert-molding of the one or more conductor tracks.

4. The conductor track carrier according to claim 1, wherein the conductor track carrier component is formed by plastic parts coupled to one another and which accommodate and hold the one or more conductor tracks at least in part.

5. The conductor track carrier according to claim 1, wherein the one or the plurality of sensors are at least one of a pressure, temperature, inclination angle, and rotational angle sensor.

6. The conductor track carrier according to claim 1, wherein an electrical contact-connection between the one sensor and at least one conductor track is formed by one of bonding, soldering, insulation displacement, press-fitting, and welding.

7. A method for producing a conductor track carrier, the method comprising the acts of:
- inserting one or more components of sensors into a sensor housing of the conductor track carrier;
- contact-connecting the components of the sensors to corresponding conductor tracks;
- wherein the conductor track carrier component is formed such that it forms at least one further component of the sensor for detecting a measurement variable; and
- wherein at least one of said sensors is a pressure sensor, the pressure sensor comprising: a pressure chamber for detecting pressure; and wherein said pressure chamber is formed by the conductor track carrier component.

8. The method according to claim 7, wherein the conductor track carrier is a leadframe insert-molded with plastic or a rigid/flexible circuit carrier.

9. The method according to claim 7, wherein the act of forming the conductor track carrier component in one piece is carried out by plastic insert-molding of the one or more conductor tracks.

10. The method according to claim 7, wherein the act of forming the conductor track carrier component in one piece is carried out by coupling plastic parts to one another, said plastic parts accommodating and holding the one or more conductor tracks at least in part.

11. The method according to claim 7, wherein the one or the plurality of sensors comprise at least one pressure, temperature, inclination angle, and rotational angle sensor.

12. The method according to claim 7, further comprising the act of:
- providing an electrical contact-connection between one sensor and at least one conductor track via one of bonding, soldering, insulation displacement, press-fitting and welding.

* * * * *